(12) United States Patent
Carlson

(10) Patent No.: US 8,986,454 B2
(45) Date of Patent: Mar. 24, 2015

(54) WINDOW ASSEMBLY FOR USE IN SUBSTRATE PROCESSING SYSTEMS

(75) Inventor: David K. Carlson, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 978 days.

(21) Appl. No.: 13/112,109

(22) Filed: May 20, 2011

(65) Prior Publication Data

US 2011/0299282 A1 Dec. 8, 2011

Related U.S. Application Data

(60) Provisional application No. 61/352,630, filed on Jun. 8, 2010.

(51) Int. Cl.
| | |
|---|---|
| C23C 16/46 | (2006.01) |
| C23C 16/52 | (2006.01) |
| H01L 21/306 | (2006.01) |
| H01L 21/67 | (2006.01) |

(52) U.S. Cl.
CPC .............................. H01L 21/67115 (2013.01)
USPC ...... 118/725; 118/715; 118/724; 156/345.27; 156/345.37; 156/345.5; 156/345.52

(58) Field of Classification Search
USPC ........ 118/715, 724, 725; 156/345.27, 345.37, 156/345.5, 345.52
See application file for complete search history.

(56) References Cited

U.S. PATENT DOCUMENTS

| | | | | |
|---|---|---|---|---|
| 5,840,125 | A * | 11/1998 | Gronet et al. ................. | 118/730 |
| 6,090,210 | A * | 7/2000 | Ballance et al. .............. | 118/725 |
| 6,187,133 | B1 * | 2/2001 | Knoot ....................... | 156/345.34 |
| 6,600,138 | B2 * | 7/2003 | Hauf et al. .................... | 219/411 |
| 6,707,011 | B2 * | 3/2004 | Tay et al. ...................... | 219/411 |
| 7,442,274 | B2 | 10/2008 | Maruyama | |
| 2007/0084408 | A1 * | 4/2007 | Yudovsky et al. ............ | 118/725 |
| 2008/0127895 | A1 | 6/2008 | Shao et al. | |
| 2010/0074604 | A1 * | 3/2010 | Koelmel et al. ............... | 392/408 |
| 2010/0267249 | A1 | 10/2010 | Kim et al. | |
| 2011/0299282 | A1 * | 12/2011 | Carlson ......................... | 362/253 |
| 2014/0004716 | A1 * | 1/2014 | Koelmel et al. ............... | 438/795 |

FOREIGN PATENT DOCUMENTS

| | | |
|---|---|---|
| JP | 1988-221622 A | 9/1988 |
| JP | 02-295121 A | 12/1990 |
| JP | 08-222532 A | 8/1996 |

OTHER PUBLICATIONS

International Search Report and Written Opinion mailed Feb. 9, 2012 for PCT Application No. PCT/US2011/038053.

* cited by examiner

Primary Examiner — Jeffrie R Lund
(74) Attorney, Agent, or Firm — Moser Taboada; Alan Taboada

(57) ABSTRACT

Embodiments of a window assembly are provided herein. In some embodiments, a window assembly for use in a substrate processing system comprising a first window at least partially transparent to light energy; a second window transparent to light energy and substantially parallel to the first window; and a separator disposed proximate the peripheral edges of the first and second windows and defining a sealed gap between the first and second windows, wherein the separator has an inlet and outlet to flow a gas through the sealed gap. In some embodiments, one or more support elements are disposed in the sealed gap to maintain a substantially uniform gap distance between the first and second windows. In some embodiments, a plurality of light adjusting elements are disposed in the gap to adjust one or more properties of light energy that passes through the light adjusting element.

15 Claims, 4 Drawing Sheets

# WINDOW ASSEMBLY FOR USE IN SUBSTRATE PROCESSING SYSTEMS

CROSS-REFERENCE TO RELATED APPLICATIONS

This application claims benefit of U.S. provisional patent application Ser. No. 61/352,630, filed Jun. 8, 2010, which is herein incorporated by reference in its entirety.

FIELD

Embodiments of the present invention generally relate to substrate processing systems and, more specifically, to window assemblies for use in substrate processing systems.

BACKGROUND

Windows can be disposed in the wall of a substrate process chamber to allow radiant energy from a light source to enter the processing volume of the process chamber. In some applications, windows may be utilized in systems configured for epitaxial deposition at reduced pressures (e.g., below atmospheric pressure). Unfortunately, the inventor has discovered that conventional windows, such as a flat, single piece of quartz or the like, perform poorly where large pressure differentials exist between the interior and exterior of the processing volume (e.g., between atmospheric pressure outside of the process chamber and the reduced pressure within the process chamber). The inventors have further discovered that conventional windows can be a source of heat loss from the processing volume and fail to provide any means for tuning the temperature of the window or the direction and/or intensity of the radiant energy entering the processing volume.

Accordingly, the inventor has provided an improved window assembly.

SUMMARY

Apparatus for use in substrate processing systems are provided herein. In some embodiments, an apparatus may include a window assembly for use in a substrate processing system comprising a first window at least partially transparent to light energy; a second window transparent to light energy and substantially parallel to the first window; and a separator disposed proximate the peripheral edges of the first and second windows and defining a sealed gap between the first and second windows, wherein the separator has an inlet and outlet to flow a gas through the sealed gap. In some embodiments, one or more support elements are disposed in the sealed gap, each support element extending between the first and second windows to maintain a substantially uniform gap distance between the first and second windows. In some embodiments, a plurality of light adjusting elements are disposed in the gap to adjust one or more properties of light energy that passes through the light adjusting element. Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
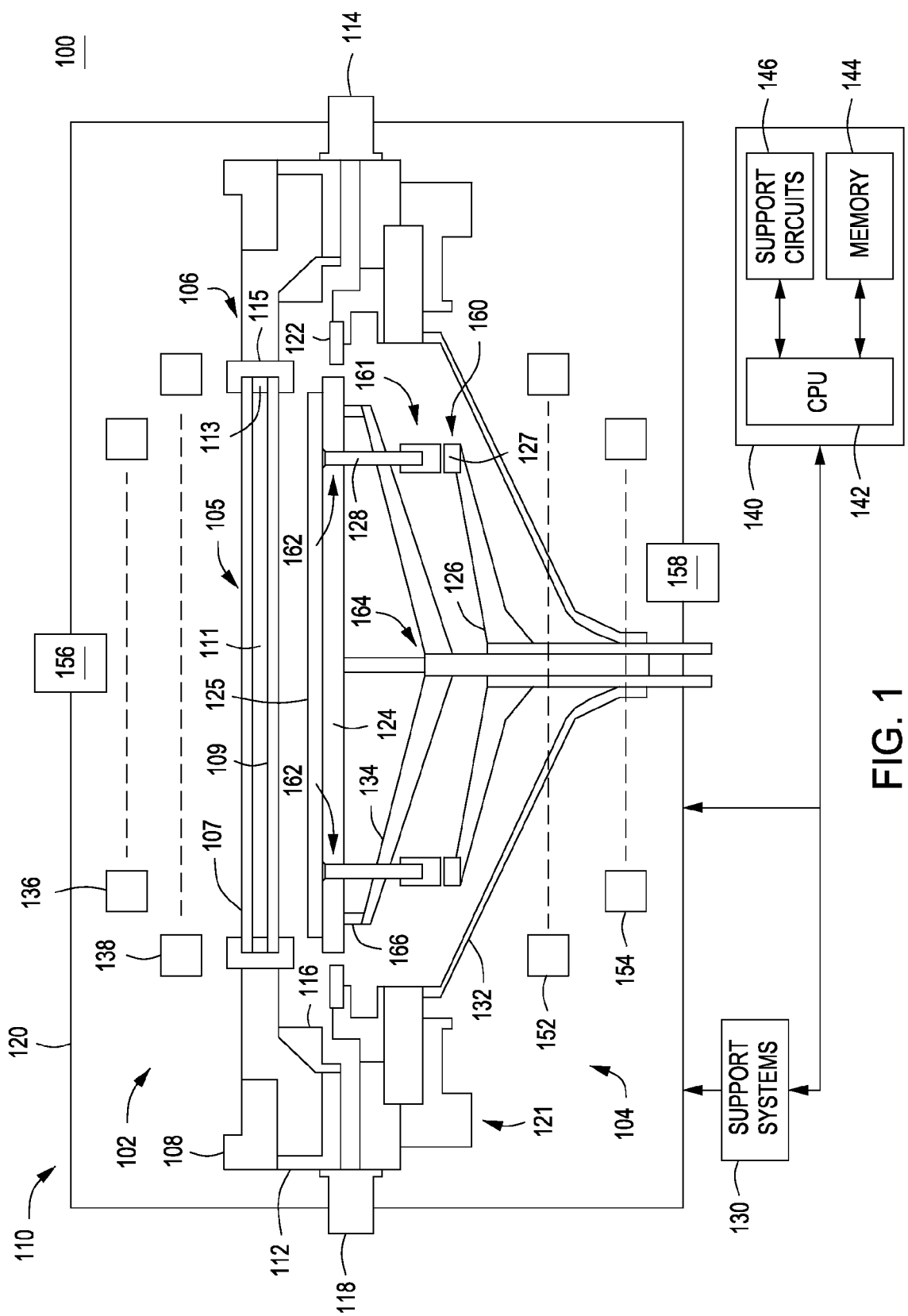
FIG. 1 depicts a schematic side view of a substrate processing system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Window assemblies for use in substrate processing systems are provided herein. The inventive window assembly may advantageously provide control and tunability of temperature independent of the temperature of a processing volume of a process chamber in which the window assembly is disposed. Further, the inventive window assembly may advantageously provide control and tunability of direction and/or intensity of radiant energy entering the processing volume through the window assembly.

Embodiments of the inventive window assembly disclosed herein may be provided in any suitable semiconductor process chamber adapted for performing epitaxial silicon deposition processes, such as the RP EPI® reactor, available from Applied Materials, Inc. of Santa Clara, Calif. An exemplary process chamber is described below with respect to FIG. 1, which depicts a schematic, cross-sectional view of a semiconductor substrate process chamber 100 suitable for performing, for example, reduced pressure epitaxial deposition processes. The epitaxial deposition process chamber described in FIG. 1 is merely illustrative, and the window assemblies as disclosed herein may by used in other process chambers as well.

The process chamber 100 illustratively includes a chamber body 110 having a lid 106 having a window assembly 105 disposed therein, support systems 130, and a controller 140. The chamber body 110 generally includes an upper portion 102, a lower portion 104, and an enclosure 120. The upper portion 102 is disposed on the lower portion 104 and includes the lid 106, a clamp ring 108, a liner 116, a baseplate 112, one or more upper lamps 136 and one or more lower lamps 138, and an upper pyrometer 156.

The lid 106 includes the window assembly 105. Generally, the window assembly 105 can include a first window 107 and a second window 109 which are substantially parallel and a separator 111 disposed between the first and second windows 107, 109. The separator 111 may be disposed proximate the peripheral edges of the first and second windows and may define a sealed gap 113 between the first and second windows. In some embodiments, the separator may have a geometry that corresponds to the first and second windows. For example, in some embodiments the first and second windows may be round, and the separator 111 may be a ring.

The first window includes an atmosphere-facing surface and the second window includes a interior-volume facing surface, which faces a interior volume of the chamber body 110. In some embodiments, a clamp 115 may be disposed about the peripheral edges of the first and second windows 107, 109 for pressing the first and second windows 107, 109 against the separator 111 to form the sealed gap 113. Embodiments of the window assembly are described below in further detail in FIGS. 2-5.

The lower portion 104 is coupled to a process gas intake port 114 and an exhaust port 118 and includes a baseplate assembly 121, a lower dome 132, a substrate support 124, a pre-heat ring 122, a substrate lift assembly 160, a substrate support assembly 164, one or more upper lamps 152 and one or more lower lamps 154, and a lower pyrometer 158. Although the term "ring" is used to describe certain components of the process chamber, such as the pre-heat ring 122, it is contemplated that the shape of these components need not be circular and may include any shape, including but not limited to, rectangles, polygons, ovals, and the like.

During processing, a substrate 125 is disposed on the substrate support 124. The lamps 136, 138, 152, and 154 are sources of infrared (IR) radiation (i.e., heat) and, in operation, generate a pre-determined temperature distribution across the substrate 125. The lid 106, the clamp ring 116, and the lower dome 132 are formed from quartz; however, other IR-transparent and process compatible materials may also be used to form these components.

Figure 2A:
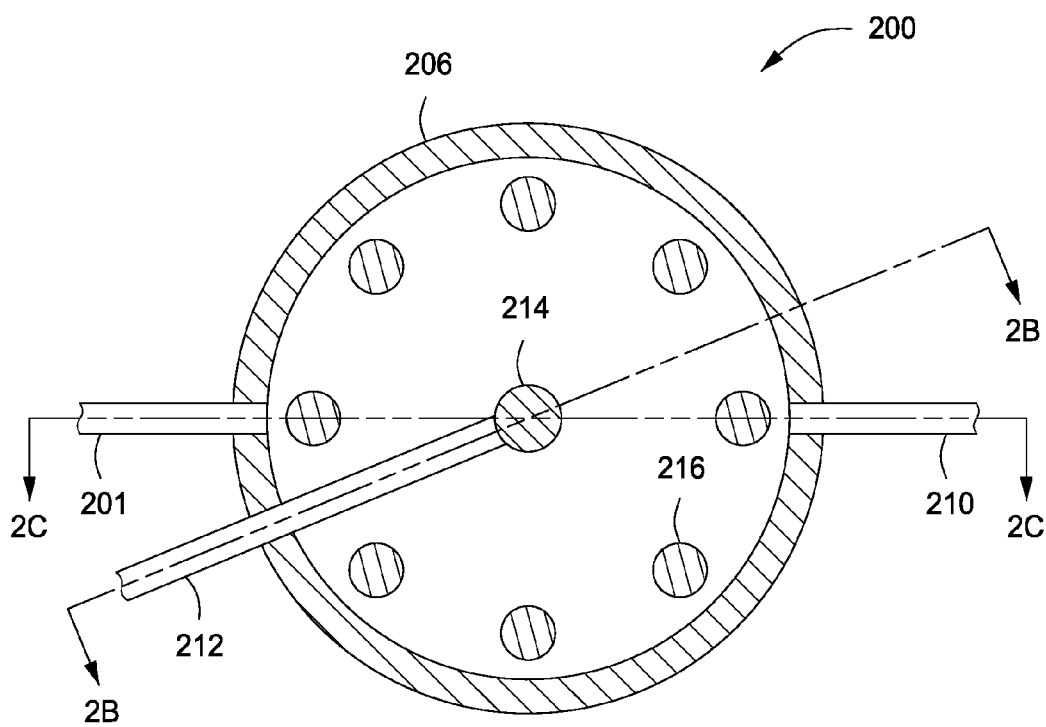
FIGS. 2A-C depict top and side cross sectional views of a window assembly in accordance with some embodiments of the present invention.
Figure 2B:
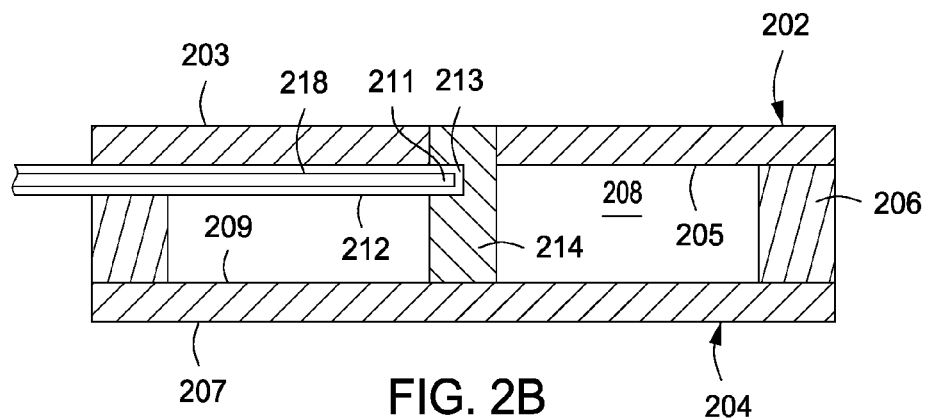
Figure 2C:
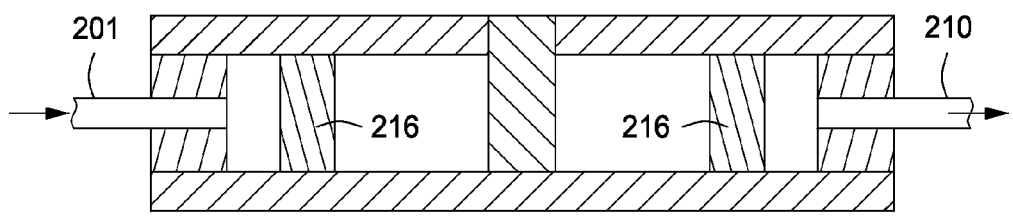

FIGS. 2A-C depict a window assembly 200 in accordance with some embodiments of the present invention. The window assembly 200 may be used as the window assembly 105 discussed above with respect to FIG. 1. The window assembly 200 includes a first window 202, a second window 204, and a separator 206. The first and second windows 202, 204 are maintained in a substantially parallel, spaced apart relation by the separator 206. The separator 206 may be disposed proximate the peripheral edges of the first and second windows 202, 204 and, together with the first and second windows 202, 204, defines a sealed gap 208 between the first and second windows 202, 204.

The first window 202 (illustrated in cross-sectional view in FIG. 2B) may be at least partially transparent to light energy, for example from the lamps 136, 138 of the process chamber 100. The first window 202 may comprise quartz or another similar optically transparent material. In embodiments where the first window 202 comprises quartz, the quartz may range in opacity from about 50 to about 90 percent. Further, the first window 202 may vary in thickness, for example to provide sufficient structural stability over a range of pressure differences between an atmosphere-facing surface 203 and a sealed gap-facing surface 205 of the first window 202. Alternatively or in combination, the thickness of the first window 202 can vary to adjust transparency of the first window 202. In some embodiments, the thickness of the first window 202 may be about 4 to about 12 mm.

The second window 204 (illustrated in cross-sectional view in FIG. 2B) may be transparent to light energy, for example from the lamps 136, 138, 152, or 156 of the process chamber 100. The second window 204 may comprise quartz or another similar optically transparent material. In embodiments where the second window 204 comprises quartz, the quartz may range in opacity from about 0 to about 50 percent. Further, the second window 204 may vary in thickness, for example to provide sufficient structural stability over a range of pressure differences between an interior volume-facing surface 207 and a sealed gap-facing surface 209 of the second window 204. Alternatively or in combination, the thickness of the second window 204 can vary to adjust transparency of the second window 204. In some embodiments, the thickness of the second window 204 may be about 2 to about 6 mm.

The first and second windows 202, 204 may have the same or different thicknesses. In some embodiments, the first window 202 may be thicker than the second window 204, for example, to maintain structural stability of the window assembly based upon pressure conditions, such as pressure differential between atmosphere and the interior volume of the process chamber 100. In some embodiments, the second window 204 may be thinner than the first window 202, for example, to provide better temperature control of the interior volume-facing surface 207 of the second window 204. The temperature of the interior volume-facing surface 207 may be adjusted by several parameters, such as thickness of the second window 204 and/or a flow rate and/or composition of a gas flowing through the sealed gap 208 (discussed in more detail below). In some embodiments, a ratio of the thickness of the first window 202 to the second window 204 ranges from about 1:1 to about 4:1 inches The separator 206 may be disposed proximate the peripheral edges of the first and second windows 202, 204 and defines the sealed gap 208 between the first and second windows 202, 204. The separator 206 may have a inlet 201 and an outlet 210 disposed in the separator 206 (as illustrated in FIG. 2C) for flowing a gas through the sealed gap 208. The gas may be any suitable gas that substantially does not deposit on or react with the materials of the window assembly. For example, the gas may include an inert gas such as nitrogen ($N_2$), a noble gas (e.g., helium (He), argon (Ar), or the like), or combinations thereof. The gas may be temperature controlled, for example by a heater or chiller (not shown) prior to entering the sealed gap 208 to facilitate controlling the temperature of the window assembly 200. Further the temperature of the window assembly 200 may be controlled by the flow rate through the sealed gap 208 and/or or the pressure level maintained in the sealed gap 208. For example, a higher pressure level in the sealed gap 208 may facilitate greater heat transfer to the surfaces of the first and second windows 202, 204 and/or absorption a greater portion of the light entering the sealed gap 208.

Figure 4:
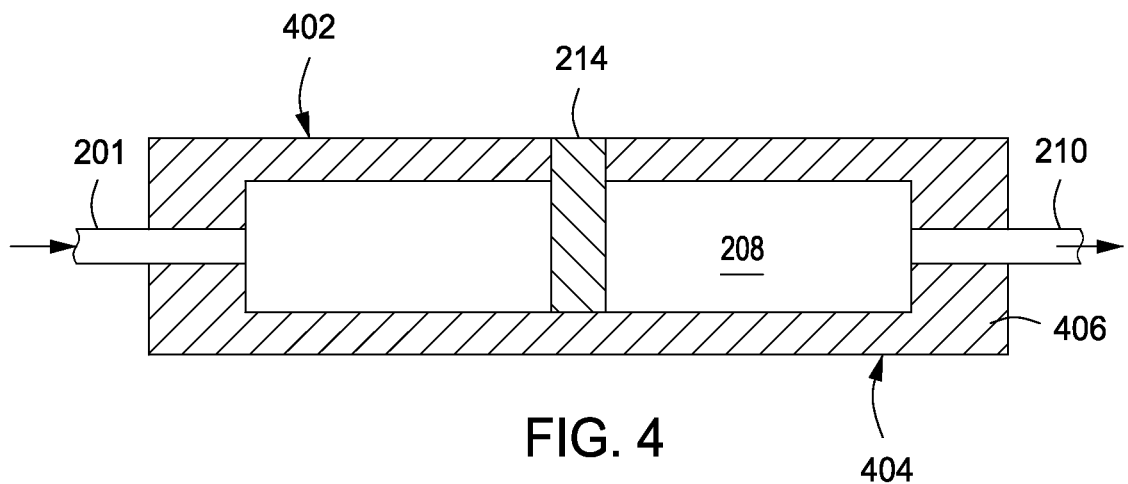
FIG. 4 depicts a side cross sectional view of a window assembly in accordance with some embodiments of the present invention.

The separator 206 may comprise any suitable material that is non-reactive with the other components of the window assembly, such as quartz, polytetrafluoroethylene (PTFE), stainless steel with o-rings, or the like. In some embodiments, such as illustrated in FIG. 4, a first window 402, a second window 404 and a separator 406 may be fabricated from the same materials, such as quartz, and may form a continuous structure (e.g., the components may be bonded together or partially or completely fabricated from a single material).

Returning to FIGS. 2A-C, the temperature of the window assembly 200 (or as approximated within in the sealed gap 208) may be measured by a sensor, such as a thermocouple, positioned to sense the temperature, or a metric correlating to temperature, of the window assembly 200 (or components thereof). For example, in some embodiments, a thermocouple 218 may be disposed in the sealed gap 208. The thermocouple 218 includes a temperature measuring tip 211. The thermocouple 218 may be disposed in a tube 212 that extends through the separator 206 and into the sealed gap 208 of the window assembly 200, for example, along the sealed gap-facing surface 205 of the first window 202. The tube 212 may be bonded to the sealed gap-facing surface 205 of the first window 202 to prevent movement of the tube 212. The interior of the tube 212 may be maintained at a different pressure than the sealed gap 208, such as at atmospheric pressure. The tube 212 may be formed of a material, for example clear quartz or the like, that is transparent to light energy passing through the window assembly 200 so that the tube does not impact the light energy passing through the window or provide a thermal shadow on the substrate. The temperature measuring tip 211 of the thermocouple 218 may be disposed at a first end 213 of the tube 212 disposed within the sealed gap 208. In some embodiments, the first end 213 may be disposed proximate the center of the window assembly 200.

In some embodiments, an opaque section 214 may be generally disposed between the light source and the position of the measuring tip 211 (or the first end 213 of the tube 212) to shield the temperature measuring tip 211 of the thermocouple 218 from light energy entering the window assembly 200 from above the first window 202 (and/or in some embodiments, from light energy entering the window assembly 200 from above the second window 204). For example, the opaque section 214 may be disposed in or on the first window 202, in or on the tube 212, or in some other suitable position. In some embodiments, the opaque section 214 may be disposed in the first window 202 (as shown in FIGS. 2A-C). The opaque section may be opaque quartz or any suitable material that is opaque to the light entering the sealed gap 208.

In some embodiments, the window assembly 200 may include one or more support elements 216 disposed in the sealed gap 208. Each support element 216 may be coupled to either or both of the first window 202 and the second window 204 and may extend between the sealed gap-facing surfaces 205, 209 of the first and second windows 202, 204 for maintaining a substantially uniform gap distance between the sealed gap-facing surfaces 205, 209. Each support element 216 may comprise a material, for example clear quartz or the like, that is transparent to light energy passing through the window assembly 200 to minimize the thermal impact each support element 216 has on energy passing through the window assembly and, for example, impinging upon a substrate. The number of support elements 216 disposed in the sealed gap 208 may vary (eight support elements are shown in FIG. 2A, but this is merely illustrative), for example, based on the pressure differential between the atmosphere-facing surface 203 of the first window 202 and the interior volume-facing surface 207 of the second window 204, the size and/or thickness of either or both of the first and second windows 202, 204, or the like.

In some embodiments, the opaque section 214 may be part of a support element (similar to support elements 216) that extends around the first end 213 of the tube 212 and through the sealed gap 208 to the sealed gap-facing surface 209 of the second window 204. Similar to support elements 216, the support element may provide structural support for the sealed gap 208 between the first and second windows 202, 204. Optionally, the support element and the opaque section 214 may be separate components, in which case the support element may be fabricated from either opaque or transparent materials.

Figure 3A:
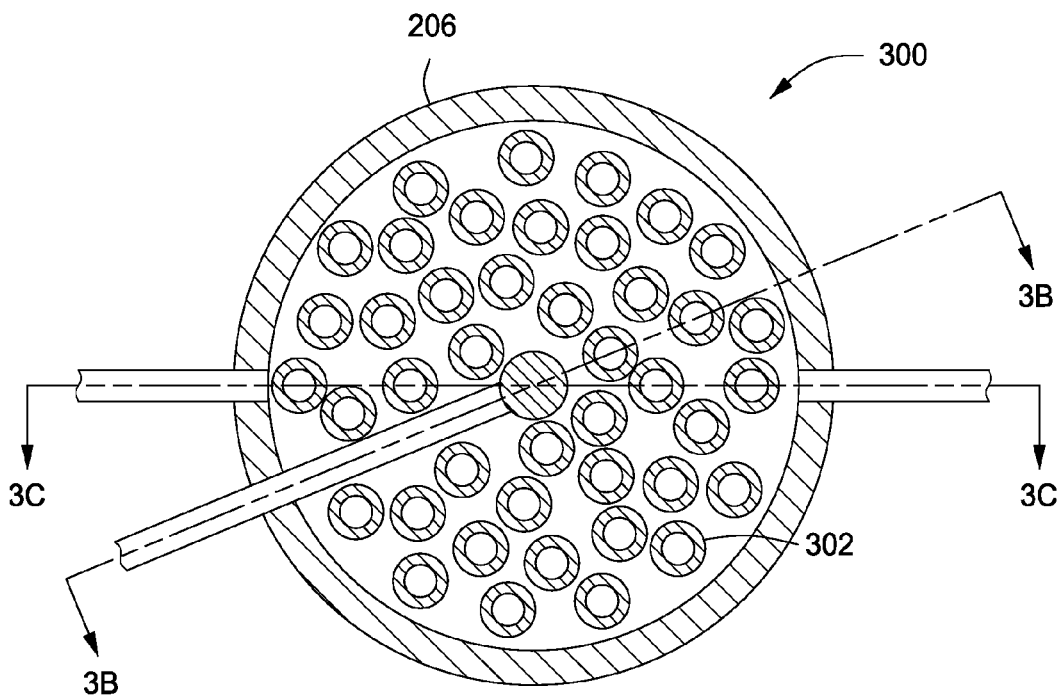
FIGS. 3A-C depict top and side cross sectional views of a window assembly in accordance with some embodiments of the present invention.
Figure 3B:
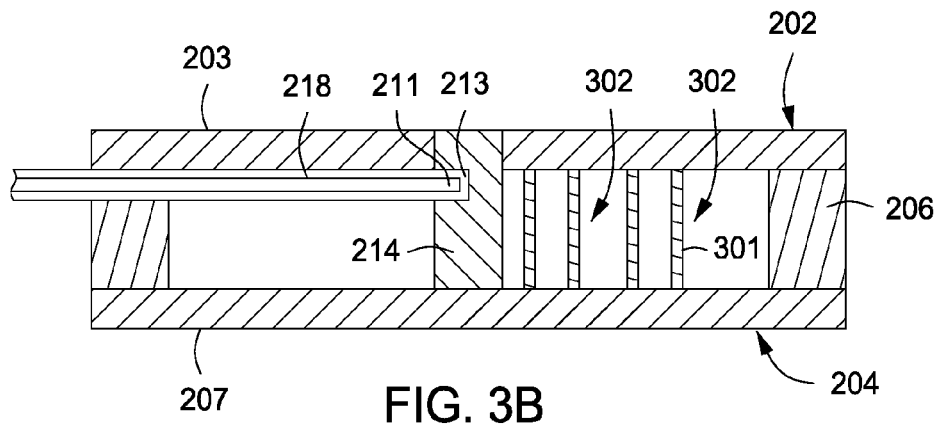
Figure 3C:
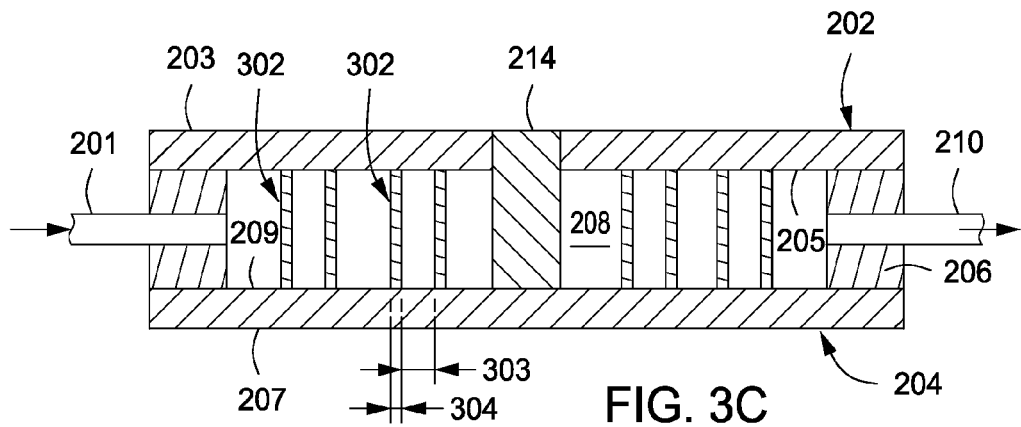

Alternative embodiments of a window assembly 300 are illustrated in FIGS. 3A-C. The window assembly 300 differs from the window assembly 200 in that the one or more support elements 216 are replaced with a plurality of light adjusting elements 302 (although, optionally, some support elements 216 may be provided). The plurality of light adjusting elements 302 are disposed in the sealed gap 208, where each element extends between the sealed gap-facing surfaces 205, 209 of the first and second windows 202, 204. The light adjusting elements 302 may additionally provide structural support for maintaining a substantially uniform gap distance between the sealed gap facing surfaces 205, 209.

The light adjusting elements 302 are not coupled to either window 202, 204, and are free to move within the gap. However, interference from adjacent light adjusting elements 302, the first and second windows 202, 204, and the separator 206, may substantially prevent the light adjusting elements 302 from moving once the window assembly 300 is assembled. By not coupling the light adjusting elements 302 to other components of the window assembly 300, the window assembly may be more easily assembled or disassembled and may flexibly be reconfigured as desired using light adjusting elements 302 having different light transmission characteristics (as discussed below).

Each light adjusting element 302 may be in the shape of a tube, for example a cylindrical tube, having a central axis perpendicular to first and second windows 202, 204 and having openings at both ends of the tube. The thickness 304 of a wall 301 of each light adjusting element 302 may range from about 1 to about 6 mm. The thickness of the wall of each light adjusting element 302 is inversely proportional to an amount of light energy that passes through the wall. Further, an inner diameter 303 of each element can be range from about 6 to about 24 mm. The thickness and inner diameter of each light adjusting element can be varied to control the degree of collimation or diffusivity of the light passing through each element. Each light adjusting element 302 may comprises clear or opaque quartz. In embodiments, where opaque quartz is used, the opacity may range from about 0 to 100 percent.

The plurality of light adjusting elements 302 may include light adjusting elements that have varied light transmission characteristics. For example, light adjusting elements 302 may have different wall thickness, inner diameter, composition, opacity, or the like (as compared to other light adjusting elements 302 in the plurality) to tailor the properties of the light energy passing through the window assembly 300. For example, varied light transmission characteristics of the light adjusting elements 302 can be utilized to tailor the collimation and/or diffusivity of the light passing through the window assembly 300 into a plurality of zones having different energy transmission characteristics. Alternatively or in combination, light adjusting elements 302 having different light transmission characteristics may be randomly distributed throughout the sealed gap 208 or in particular zones to randomize the distribution of the light energy passing through the window assembly. Use of the light adjusting elements 302 to create zones advantageously prevents sharp delineation between zones, thereby allowing a more smooth transition of the thermal gradient between zonal regions, for example, on a substrate disposed beneath the window.

Figure 5:
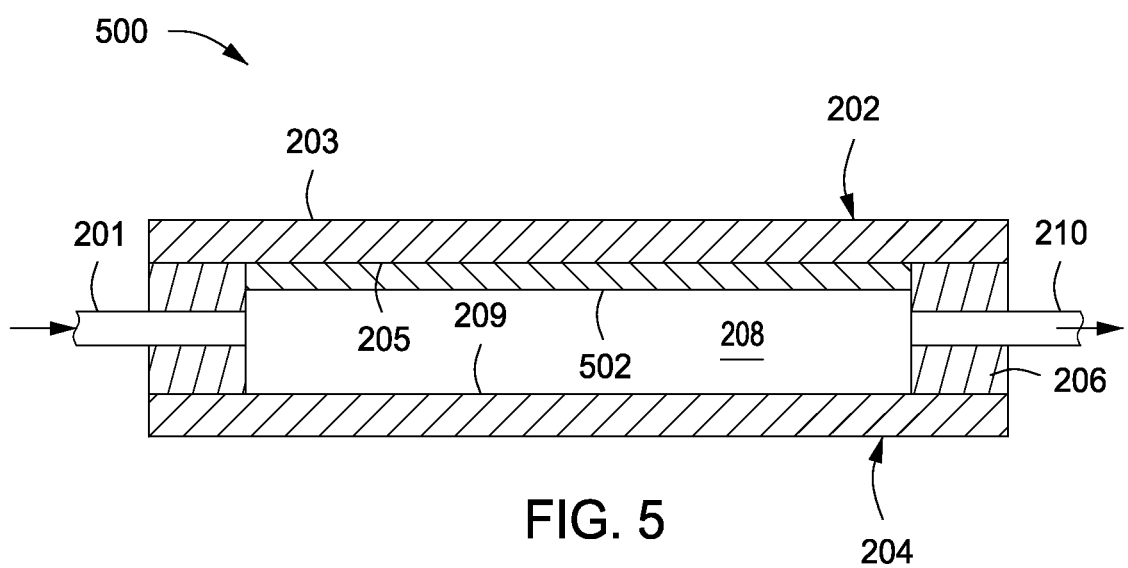
FIG. 5 depicts a side cross sectional view of a window assembly in accordance with some embodiments of the present invention.

In some embodiments, for example in single-sided heating embodiments, a window assembly can act as a reflector. For example, FIG. 5 depicts a window assembly 500 in cross sectional view which may be utilized in the process chamber 100 for a single-sided heating embodiment, for example, when light energy is provided by the lamps 152, 154 disposed below the substrate 125. The window assembly 500 may include any of the components described in accordance with window assemblies 200, 300 such as the thermocouple 218, one or more support elements 216, and/or a plurality of light adjusting elements 302. In FIG. 5, these components have been omitted merely as a matter of clarity.

The window assembly 500 includes a reflective coating 502 disposed on the sealed gap-facing surface of the first window 202. The reflective coating 502 may comprise any suitable process-compatible reflective material, such as at least one of gold (Au), nickel (Ni), silver (Ag), reflective quartz, or the like. In operation, light energy enters the window assembly 500 through the second window 204, passes through the sealed gap 208 and is reflected from the reflective coating 502 back through the sealed gap 208 and out through the second window 204 towards the substrate 125. In embodiments where a plurality of light adjusting elements 302 are included in the sealed gap 208, the light adjusting elements in the plurality may be varied in opacity and/or size of the elements to tailor the collimation and/or diffusivity of the light energy entering the sealed gap 208 and reflected from the reflective coating 502.

Returning to FIG. 1, the substrate support assembly 164 generally includes a support bracket 134 having a plurality of support pins 166 coupled to the substrate support 124. In some embodiments, the substrate support assembly 164 may be configured to provide rotation of the substrate. The substrate lift assembly 160 comprises a substrate lift shaft 126 and a plurality of lift pin modules 161 selectively resting on respective pads 127 of the substrate lift shaft 126. In one embodiment, a lift pin module 161 comprises an optional upper portion of the lift pin 128 is movably disposed through a first opening 162 in the substrate support 124. In operation, the substrate lift shaft 126 is moved to engage the lift pins 128. When engaged, the lift pins 128 may raise the substrate 125 above the substrate support 124 or lower the substrate 125 onto the substrate support 124.

The support systems 130 include components used to execute and monitor pre-determined processes (e.g., growing epitaxial silicon films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 generally comprises a central processing unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems.

Thus, embodiments of a window assembly for use in a substrate processing system are provided herein. The inventive window assembly advantageously provides control and tunability of temperature independent of the temperature of a processing volume of a process chamber in which the window assembly is disposed. Further, the inventive window assembly advantageously provided control and tunability of direction and/or intensity of radiant energy entering the processing volume through the window assembly.

While the foregoing is directed to embodiments of the present invention, other and further embodiments of the invention may be devised without departing from the basic scope thereof.

The invention claimed is:

1. A window assembly for use in a substrate processing system, comprising:
    a first window at least partially transparent to light energy;
    a second window transparent to light energy and substantially parallel to the first window;
    a separator disposed proximate the peripheral edges of the first and second windows and defining a sealed gap between the first and second windows, wherein the separator has an inlet and outlet to flow a gas through the sealed gap; and
    a plurality of light adjusting elements disposed in the cap that adjust one or more properties of light energy that passes through the light adjusting element.

2. The window assembly of claims 1, further comprising:
    one or more support elements disposed in the sealed gap and coupled to at least one of the first window or the second window, each support element extending between the first and second windows to maintain a substantially uniform gap distance between the first and second windows.

3. The window assembly of claim 1, where each light adjusting element further comprises:
    a cylindrical tube having a central axis perpendicular to the first and second windows and having openings at both ends of the cylindrical tube.

4. The window assembly of claim 3, wherein the thickness of a wall of each cylindrical tube ranges from about 1 to about 6 mm.

5. The window assembly of claim 3, wherein the thickness of a wall of each cylindrical tube is inversely proportional to an amount of light energy that passes through the wall.

6. The window assembly of claim 3, wherein each light adjusting element comprises quartz.

7. The window assembly of claim 6, wherein the opacity of the quartz in each light adjusting element ranges from about 0 to about 100 percent.

8. The window assembly of claim 1, further comprising:
    a tube transparent to light energy passing through the window assembly and extending through the separator and into the gap of the window assembly along a gap-facing surface of the first window;
    an opaque quartz section disposed in the first window and above a gap-facing end of the tube; and
    a thermocouple disposed in the tube and having a temperature measuring tip located in the gap-facing end of the tube.

9. The window assembly of claim 1, wherein a ratio of a first thickness of the first window to a second thickness of the second window ranges from about 1:1 to about 4:1.

10. The window assembly of claim 1, wherein the first window, the second window and the separator comprise quartz.

11. The window assembly of claim 1, wherein the first and second windows comprise quartz and the separator comprises polytetrafluoroethylene (PTFE).

12. The window assembly of claim 1, wherein the window assembly is disposed in a process chamber of a substrate processing system, wherein the process chamber has an interior volume and a substrate support disposed therein,
    wherein the substrate processing system further comprises a light source to direct light energy towards the substrate support, and
    wherein the first window of the window assembly has an atmosphere-facing surface and the second window of the window assembly has an interior volume-facing surface.

13. The window assembly of claim 12, wherein the window assembly is disposed above the substrate support and between the substrate support and the light source.

14. The window assembly of claim 13, wherein the first window has a first thickness that is greater than a second thickness of the second window.

15. The window assembly of claim 12, wherein the window assembly is disposed above the substrate support and the light source is disposed below the substrate support.

* * * * *